United States Patent
Lin et al.

(10) Patent No.: US 7,409,668 B2
(45) Date of Patent: Aug. 5, 2008

(54) METHOD FOR IMPROVING VIA'S IMPEDANCE

(75) Inventors: Yu-Hsu Lin, San-Jose, CA (US); Shang-Tsang Yeh, Tu-cheng (TW); Chuang-Bing Li, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 137 days.

(21) Appl. No.: 11/392,003

(22) Filed: Mar. 29, 2006

(65) Prior Publication Data

US 2007/0074905 A1 Apr. 5, 2007

(30) Foreign Application Priority Data

Aug. 19, 2005 (CN) .................. 2005 1 0036761

(51) Int. Cl.
*G06F 17/50* (2006.01)
*G06F 19/00* (2006.01)

(52) U.S. Cl. ............... 716/15; 716/4; 716/2; 700/97; 700/110; 703/2; 703/14

(58) Field of Classification Search .............. 716/4, 716/2, 15; 700/97, 110; 703/2, 14
See application file for complete search history.

(56) References Cited

U.S. PATENT DOCUMENTS

| 6,076,726 | A |  | 6/2000 | Hoffmeyer et al. |
| 6,161,215 | A | * | 12/2000 | Hollenbeck et al. ........... 716/15 |
| 6,388,206 | B2 |  | 5/2002 | Dove et al. |
| 6,512,377 | B1 |  | 1/2003 | Deng et al. |
| 6,557,154 | B1 | * | 4/2003 | Harada et al. ................. 716/11 |
| 6,665,627 | B2 | * | 12/2003 | Jain et al. .................... 702/117 |
| 6,976,233 | B1 | * | 12/2005 | Frank et al. .................... 716/4 |
| 6,983,434 | B1 | * | 1/2006 | Frank et al. .................... 716/5 |

(Continued)

FOREIGN PATENT DOCUMENTS

| CN | 2634760 Y |  | 8/2004 |
| JP | 04109701 A | * | 4/1992 |
| JP | 2000241451 A | * | 9/2000 |
| JP | 2001230508 A | * | 8/2001 |
| JP | 2003347692 A | * | 12/2003 |
| WO | WO 2004/082180 |  | 9/2004 |
| WO | WO 2006056473 A2 | * | 6/2006 |

OTHER PUBLICATIONS

Hong-Guan Low, Mahadevan K. Iyer, Ban-Leong Ooi, Mook-Seng Leong, "Via Design Optimisation For High Speed Device Packaging", 1998 IEEE/CPMT Electronics Packaging Technology Conference, 1998, pp. 112-118, Singapore.

*Primary Examiner*—Phallaka Kik
(74) *Attorney, Agent, or Firm*—Morris Manning Martin LLP; Tim Tingkang Xia, Esq.

(57) ABSTRACT

A method is for controlling an impedance of a via of a printed circuit board. The Via is connected with a trace and includes a drill hole, a pad and an anti-pad. The method includes steps of: building a math model; testing whether an impedance of the via matching with an impedance of the trace; analyzing the impedance of the via if passing the testing; and adjusting parameters of the pad, the anti-pad, and the drill hole if fails testing, and returning to the simulating step, till impedance matching achieved. The method which can efficiently keep signals integrality and increase signal transmission speed.

10 Claims, 2 Drawing Sheets

U.S. PATENT DOCUMENTS

| | | | |
|---|---|---|---|
| 7,013,452 B2* | 3/2006 | Baras et al. | 716/15 |
| 7,047,515 B1* | 5/2006 | Vitek et al. | 716/15 |
| 7,196,531 B2* | 3/2007 | Grube et al. | 324/754 |
| 7,257,796 B2* | 8/2007 | Miller et al. | 716/12 |
| 7,284,221 B2* | 10/2007 | Winings et al. | 716/11 |
| 7,307,492 B2* | 12/2007 | Tripathi et al. | 333/111 |
| 2003/0101426 A1* | 5/2003 | Sarkinen et al. | 716/12 |
| 2003/0115568 A1* | 6/2003 | Miller et al. | 716/15 |
| 2004/0176938 A1* | 9/2004 | Gisin et al. | 703/14 |
| 2005/0125751 A1* | 6/2005 | Miller et al. | 716/4 |
| 2005/0197817 A1* | 9/2005 | Iwaki et al. | 703/14 |
| 2006/0288317 A1* | 12/2006 | Hamada et al. | 716/5 |

* cited by examiner

METHOD FOR IMPROVING VIA'S IMPEDANCE

BACKGROUND OF THE INVENTION

1. Field of the Invention

The present invention relates to a method of controlling impedance of vias, and more particularly to a method of controlling impedance of vias for efficiently maintaining signal integrity and increasing signal transmission speed.

2. General Background

Conventionally, there has been a high-frequency multilayer circuit substrate, in which transmission lines are connected by way of vias provided for the improvement in performance of a high-frequency circuit and for high-density mounting. As reduction in size and increase in transmission signal frequency of this multilayer circuit substrate have been needed, a transmission loss due to signal wave reflection in the transmission lines and via connecting portion have become a more serious problem. These may harm integrity of the signals. Stray capacitance and parasitic inductance of the vias always exist. The stray capacitance may delay a rising time of the signal and decrease a transmitting speed of the signal. The parasitic inductance may weaken shunt capacitors mounted on the circuit substrate and lead to a poor filter performance of the circuit substrate. The high-frequency multilayer circuit substrate is required to control the characteristic impedance of the vias.

What is desired, therefore, is a method of controlling impedance of vias which can efficiently maintaining signal integrity and increase signal transmission speed.

SUMMARY

In one preferred embodiment, a method of controlling impedance of vias of a PCB includes: building a math model, simulating a design of via and trace construction for the PCB by utilizing simulation software, building the PCB according to the simulated design and verifying physical size of the via if impedance matching is achieved, and adjusting parameters of the pad, the anti-pad, and the drill hole if impedance matching is not achieved, and returning to the simulating step, until impedance matching is achieved.

Other advantages and novel features will become more apparent from the following detailed description of a preferred embodiment when taken in conjunction with the accompanying drawings, in which:

DETAILED DESCRIPTION OF THE EMBODIMENTS

Figure 1:
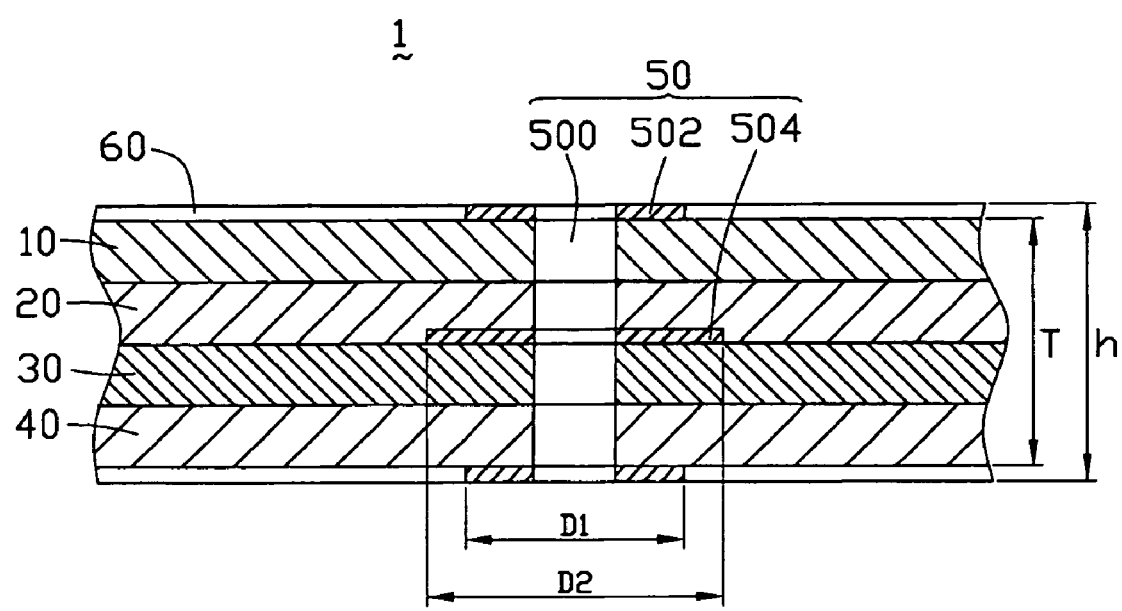
FIG. 1 is a cross sectional view of a PCB utilized in a preferred embodiment of the present invention.

Referring to FIG. 1, a PCB (printed circuit board) 1 includes a first signal layer 10, a power layer 20, a ground layer 30, and a second signal layer 40, one below another in turn. A via 50 is defined throughout the PCB board 1. Traces 60 are separately arranged on the first signal layer 10 and the second layer 40. The via 50 includes a drill hole 500. A pair of pads 502 is formed encircling ends of the drill hole 500, connecting the traces 60 to the via 50, and respectively contacting the first signal layer 10 and the second signal layer 40. An anti-pad 504 is formed encircling a middle portion of the drill hole 500 and sandwiched between the ground layer 30 and the power layer 20.

An impedance of the via 50 is Z, a stray capacitance of the via 50 is $C_j$, and a parasitic inductance of the via 50 is $L_j$. The stray capacitance $C_J$ may delay a rising time of signals and decrease a transmitting speed of signal. The parasitic inductance $L_j$ may weaken shunt capacitors mounted on the PCB 1 and leads to a poor filter performance of the PCB 1.

$$Z = \sqrt{L/C} \qquad (1)$$

$$C_j = 1.41 \epsilon_r D_1 T / (D_2 - D_1) \qquad (2)$$

$$L_j = 5.08 h [\ln(4h/d) + 1] \qquad (3)$$

From formula (1), it is known that the impedance Z of the via 50 is inversely proportional to the stray capacitance $C_j$ and is proportional to the parasitic inductance $L_j$.

In formula (2), D1 is a diameter of the pad 502, D2 is a diameter of the anti-pad 504, T is a thickness of the PCB 1, and $\epsilon_r$ is a dielectric coefficient of substrates of the PCB 1. We know from the formula, to reduce the stray capacitance $C_j$, we should increase the diameter D2 of the anti-pad 504, and decrease the diameter D1 of the pad 502.

In formula (3), d is a diameter of the drill hole 500, h is a length of the via 50. We know from the formula to reduce the parasitic inductance $L_j$, we should decrease the length of the pad 502.

A relationship between parameters of the pad 502, the anti-pad 504, and the drill hole 500 can be concluded from the formulas (1), (2), (3). The impedance of the trace 60 is known. The length h of the via 50 and the thickness T of the PCB 1 are assigned certain values. The parameters of the pad 502, the anti-pad 504, and the drill hole 500 are adjusted using a simulating software until impedance matching between the trace 60 and the via 50 is archived. So groups of parameters of the via 50 are gotten, as shown in following chart 1. Then produce the PCB 1 with the via 50 according to the parameters from the simulation and verify physical sizes of the via 50 using a manner of time domain reflection (TDR). E.g. when the impedance of the trace 60 is 60Ω, the diameter of the drill hole 500 is adjusted from 12 mil to 14 mil, the diameter of the pad 502 is increased from 24 mil to 25 mil, the diameter of the anti-pad 504 is decreased from 34 mil to 44 mil. As a result, the impedance of the via 50 is changed from 45Ω to 60Ω, impedance matching is also achieved.

CHART 1

| group parameter | | Impedance of the trace (Ω) | Width of the trace (mil) | Diameter of the drill hole (mil) | Diameter of the pad (mil) | Diameter of the anti-pad (mil) | Impedance of the via (Ω) |
|---|---|---|---|---|---|---|---|
| 1 | original | 60 | 5 | 12 | 24 | 34 | 48 |
|   | adjusted | 60 | 5 | 14 | 25 | 44 | near to 60 |

CHART 1-continued

| group | parameter | Impedance of the trace (Ω) | Width of the trace (mil) | Diameter of the drill hole (mil) | Diameter of the pad (mil) | Diameter of the anti-pad (mil) | Impedance of the via (Ω) |
|---|---|---|---|---|---|---|---|
| 2 | original | 50 | 7 | 12 | 25 | 36 | 44 |
|   | adjusted | 50 | 7 | 14 | 25 | 40 | near to 60 |
| 3 | original | 40 | 10 | 12 | 25 | 36 | 45 |
|   | adjusted | 40 | 10 | 18 | 25 | 36 | near to 60 |

Figure 2:
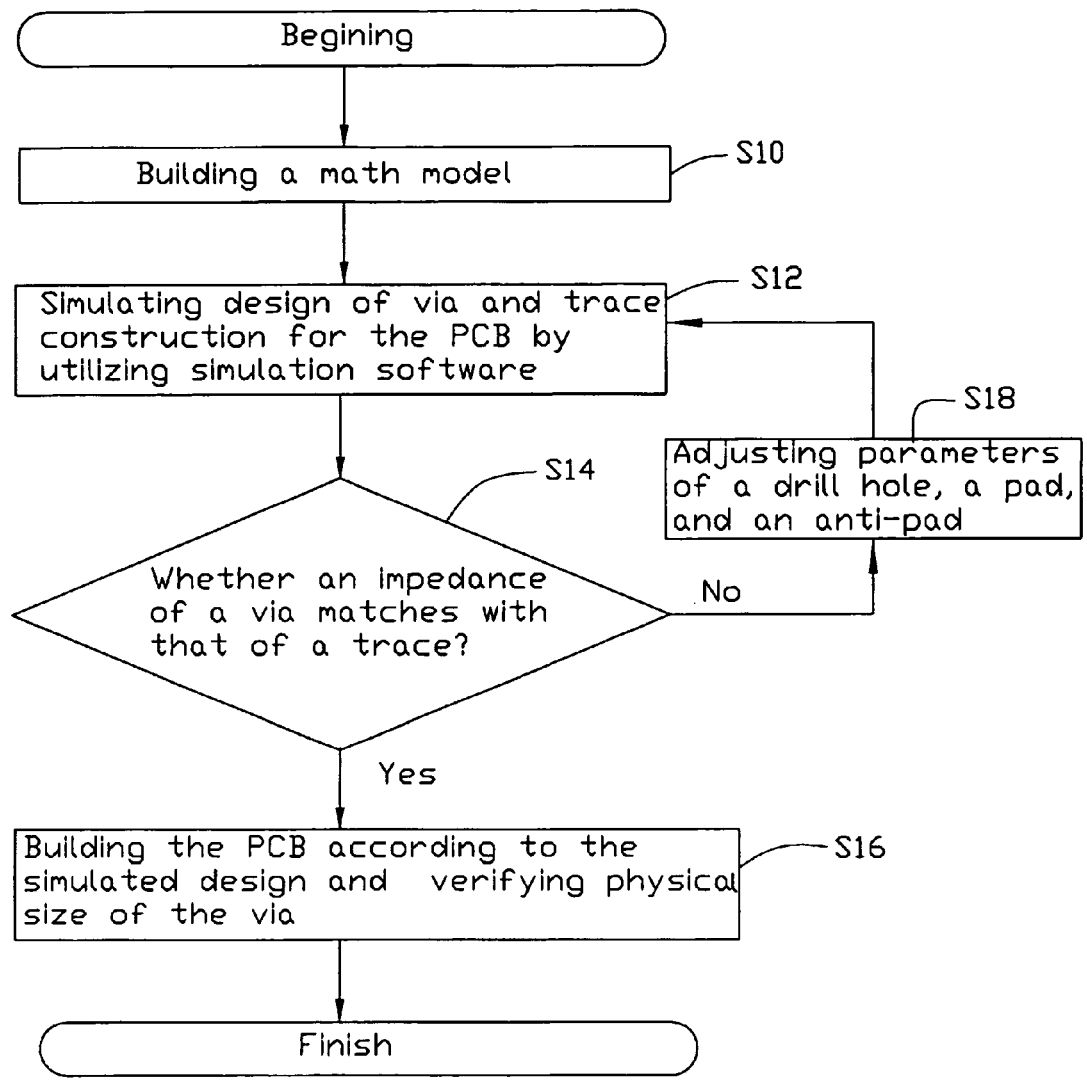
FIG. 2 is a flow chart of a method of controlling impedance of vias of the PCB in accordance with a preferred embodiment of the present invention.

Referring to FIG. 2, a method of controlling impedance of vias in accordance with a preferred embodiment of the present invention includes the following steps.

Step 10: building a math model;

Step 12: simulating a PCB having traces, vias, and pads using a simulation software of computer simulation technology (CST);

Step 14: indicating whether the impedance of the vias matches with that of traces of our simulated design;

Step 16: adjusting parameters of the pads, the anti-pads, and the drill holes until impedance matching is achieved;

Step 18: produce the PCB according to the results of step 16 and verify the physical sizes of the vias to match the impedances of the traces using a manner of time domain reflection (TDR).

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A method of controlling an impedance of a via of a printed circuit board (PCB), the via connected with traces and comprising a drill hole, a pad, and an anti-pad, the method comprising:
   building a math model;
   simulating a design of via and trace construction for the PCB by utilizing simulation software;
   indicating whether an impedance of the via matches with an impedance of the trace in the simulation;
   building the PCB according to the simulated design and verifying physical size of the via if impedance matching is achieved; and
   adjusting parameters of the pad, the anti-pad, and the drill hole if impedance matching is not achieved, and returning to the simulating step, until impedance matching is achieved.

2. The method as claimed in 1, wherein the simulation software utilizes software of computer simulation technology (CST).

3. The method as claimed in 1, wherein the step of verifying comprising using time domain reflection (TDR).

4. The method as claimed in claim 1, wherein the step of adjusting parameters comprises one of methods of increasing a diameter of the anti-pad, decreasing a diameter of the pad, and decreasing a diameter of the drill hole.

5. A method of controlling an impedance of a via of a printed circuit board (PCB), the printed circuit board comprising signal layers, a ground layer, and a power layer, the method comprising:
   defining a drill hole through the printed circuit board;
   forming a pad encircling the drill hole and bonded with the signal layer;
   forming an anti-pad encircling the drill hole;
   building a math model;
   simulating a design of a PCB with a via and traces with simulation software;
   indicating whether an impedance of the via matches with an impedance of the traces in the simulated design;
   building the PCB with the via using time domain reflection (TDR); and
   adjusting parameters of the pad, the anti-pad, and the drill hole if impedance matching fails, and returning to the simulating step, until impedance matching is achieved.

6. The method as claimed in claim 5, wherein the simulation software utilizes software of computer simulation technology (CST).

7. The method as claimed in claim 5, wherein the step of adjusting parameters comprises one of methods of increasing a diameter of the anti-pad, decreasing a diameter of the pad, and decreasing a diameter of the drill hole.

8. A method of controlling an impedance of a via of a printed circuit board (PCB), the via connected with traces and comprising a drill hole, a pad, and an anti-pad, an impedance of the via adjusted to match with an impedance of the traces, the method comprising:
   building a math model;
   simulating a design of a PCB with a via and traces with simulation software;
   indicating whether an impedance of the via matches with an impedance of the traces in the simulated design;
   building the PCB with the via using time domain reflection (TDR); and
   adjusting diameters of the anti-pad, the pad, and the drill hole to reduce a stray capacitance and a parasitic inductance of the via, if impedance matching fails, and returning to the simulating step, until impedance matching is achieved.

9. The method as claimed in claim 8, wherein the simulation software utilizes software of computer simulation technology (CST).

10. The method as claimed in claim 8, wherein the step of adjusting comprises one of methods of increasing a diameter of the anti-pad, decreasing a diameter of the pad, and decreasing a diameter of the drill hole.

* * * * *